US 6,573,715 B2

(12) United States Patent
King et al.

(10) Patent No.: US 6,573,715 B2
(45) Date of Patent: Jun. 3, 2003

(54) POROSITY AND PERMEABILITY MEASUREMENT OF UNDERGROUND FORMATIONS CONTAINING CRUDE OIL, USING EPR RESPONSE DATA

(75) Inventors: James D. King, San Antonio, TX (US); Qingwen Ni, San Antonio, TX (US); Armando De Los Santos, San Antonio, TX (US)

(73) Assignee: Southwest Research Institute, San Antonio, TX (US)

(*) Notice: Subject to any disclaimer, the term of this patent is extended or adjusted under 35 U.S.C. 154(b) by 0 days.

(21) Appl. No.: 09/788,016

(22) Filed: Feb. 16, 2001

(65) Prior Publication Data

US 2001/0028247 A1 Oct. 11, 2001

Related U.S. Application Data

(63) Continuation-in-part of application No. 09/296,433, filed on Apr. 21, 1999, now abandoned.
(60) Provisional application No. 60/082,647, filed on Apr. 22, 1998.

(51) Int. Cl.[7] .................................................. G01V 3/00
(52) U.S. Cl. ....................................... 324/303; 324/300
(58) Field of Search ................................. 324/303, 300, 324/309, 316, 319, 306, 314, 338, 339

(56) References Cited

U.S. PATENT DOCUMENTS

| 3,020,469 A | 2/1962 | O'Reilly .................... 324/0.5 |
| 3,060,371 A | 10/1962 | Townsend et al. ........... 324/0.5 |
| 3,096,476 A | 7/1963 | Poindexter et al. .......... 324/0.5 |
| 4,415,671 A | 11/1983 | Nicksie ....................... 436/29 |
| 4,531,093 A | 7/1985 | Rollwitz et al. ............. 324/300 |
| 4,560,663 A | 12/1985 | Nicksie et al. ............... 436/25 |
| 4,719,425 A | 1/1988 | Ettinger ..................... 324/316 |
| 4,804,918 A | 2/1989 | Vail, III ..................... 324/303 |
| 5,122,746 A | 6/1992 | King et al. ................. 324/307 |
| 5,136,243 A | 8/1992 | Starewicz et al. ........... 324/318 |
| 5,302,898 A | 4/1994 | Pethig et al. ............... 324/316 |
| 5,389,878 A | 2/1995 | Nakagawa et al. .......... 324/316 |
| 5,465,047 A | 11/1995 | Nakanishi et al. .......... 324/316 |
| 5,475,310 A | 12/1995 | Pocachard et al. .......... 324/346 |
| 5,488,950 A | 2/1996 | Ehnholm .................. 128/653.1 |
| 5,564,421 A | 10/1996 | Ehnholm .................. 128/653.2 |
| 5,610,522 A | 3/1997 | Locatelli et al. ............ 324/319 |
| 5,684,399 A | 11/1997 | Bayer ........................ 324/306 |
| 6,346,813 B1 * | 2/2002 | Agrawal et al. ............. 324/303 |

FOREIGN PATENT DOCUMENTS

| GB | 2310500 | 8/1997 | ............ G01V/3/32 |
| WO | WO 93/19475 | 9/1993 | ............ G01R/7/02 |
| WO | WO 97/14063 | 4/1997 | ............ G01V/3/00 |

OTHER PUBLICATIONS

PCT International Search Report, Form PCT/ISA/210. Aug. 6, 1999.

C. Chardaire–Rivièe and J.C. Roussel, *Principle and Potential of Nuclear Magnetic Resonance Applied to the Study of Fluids in Porous Media*, Revue De L'Institut Français Du Petrole, vol. 47 N°4, Juiilet–Aout 1992.

* cited by examiner

*Primary Examiner*—Edward Lefkowitz
*Assistant Examiner*—Brij B. Shrivastav
(74) *Attorney, Agent, or Firm*—Baker Botts L.L.P.

(57) ABSTRACT

A method and apparatus (10) for detecting and measuring the amount of crude oil in underground rock formations. EPR measurements are used to calculate the amount of crude oil, and may be calibrated to determine the particular type of crude oil. These measurements may be used in conjunction with NMR measurements, to provide accurate estimations of pore size and permeability.

19 Claims, 4 Drawing Sheets

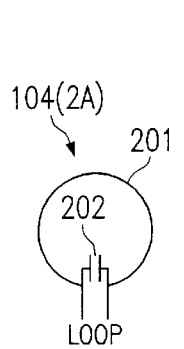
FIG. 2A LOOP
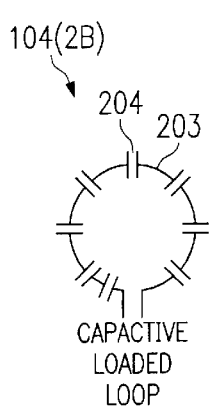
FIG. 2B CAPACITIVE LOADED LOOP
FIG. 2C DIPOLE
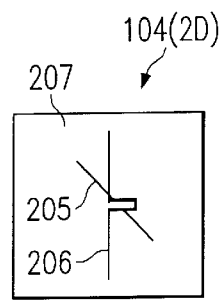
FIG. 2D CROSSED DIPOLES
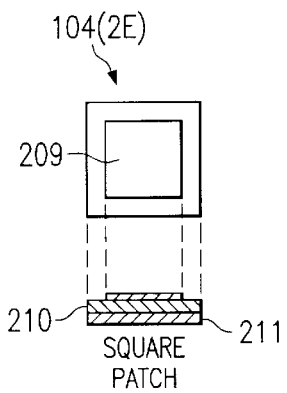
FIG. 2E SQUARE PATCH
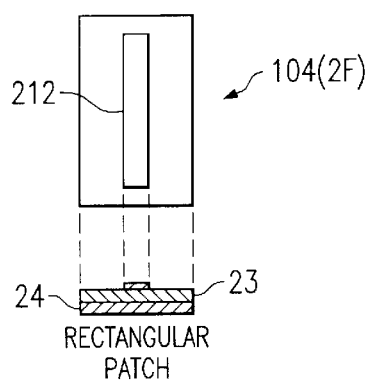
FIG. 2F RECTANGULAR PATCH
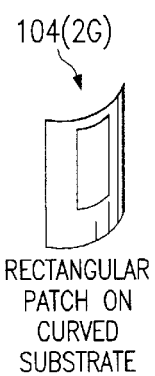
FIG. 2G RECTANGULAR PATCH ON CURVED SUBSTRATE
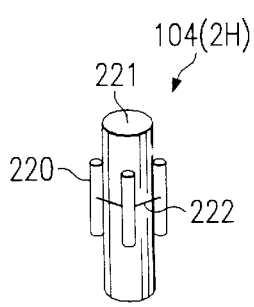
FIG. 2H PHASED ARRAY OF DIPOLES
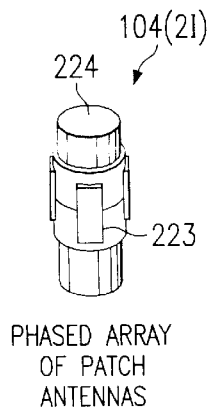
FIG. 2I PHASED ARRAY OF PATCH ANTENNAS
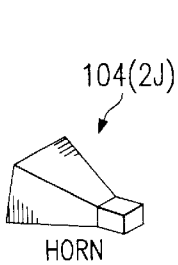
FIG. 2J HORN
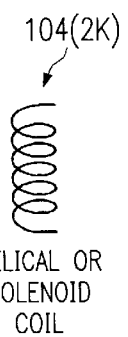
FIG. 2K HELICAL OR SOLENOID COIL

POROSITY AND PERMEABILITY MEASUREMENT OF UNDERGROUND FORMATIONS CONTAINING CRUDE OIL, USING EPR RESPONSE DATA

RELATED PATENT APPLICATION

This application is a continuation-in-part of application Ser. No. 09/296,433, filed Apr. 21, 1999 now abandoned and entitled "Porosity And Permeability Measurement Of Underground Formations Containing Crude Oil, Using EPR Response Data" which claims the benefit of U.S. Provisional Application No. 60/082,647, filed Apr. 22, 1998 and entitled "Porosity and Permeability Measurement of Underground Formations Containing Crude Oil Using NMR and ESR Data".

TECHNICAL FIELD OF THE INVENTION

This invention relates to locating subterranean formations of crude oil, and more particularly to determining porosity and permeability parameters of such formations.

BACKGROUND OF THE INVENTION

Technological advances in crude oil exploration are permitting crude oil to be captured from locations previously considered to be impractical or unprofitable. For example, nuclear magnetic resonance (NMR) technology has been used for well logging applications to measure hydrogenous materials located a short distance into the earth's structure about the bore hole. NMR can simultaneously sense the hydrogen in water and in oil and other materials that may be present within the sensitive measurement region, and thereby indicate the presence and amount of those materials.

Sometimes the water and oil constituents contributing to the total NMR response signal can be resolved to the allow concentration of each to be determined. In other cases, separate measurements of the oil and water may not be feasible with NMR alone.

When the hydrogenous material is contained within an underground rock formation, NMR techniques may be used to determine pore size distribution and the porosity and the permeability of the rock. With this information, a decision can be made whether a particular rock formation contains a sufficient amount of recoverable fluid such that drilling is profitable. However, NMR porosity and permeability estimates do not typically attempt to differentiate between the effect of varying proportions of oil and water in the fluid.

SUMMARY OF THE INVENTION

The invention uses a magnetic resonance technology, specifically electron paramagnetic resonance (EPR), also known as electron spin resonance (ESR), to detect and measure the concentration of crude oil and certain other hydrocarbon solids and liquids contained within underground formations. Such detection and measurement may be obtained from the surface of the earth to appreciable depths below the surface. They may also be obtained from locations adjacent to the walls of natural openings in the earth's surface (such as caves, open faults, cliffs, sink holes, and hillsides) or in man made earth penetrations (such as tunnels, wells, trenches or boreholes).

The use of EPR data is particularly advantageous in that EPR response signals emanate only from unpaired electrons, such as those due to broken bonds in high molecular weight (MW) hydrocarbon compounds, in paramagnetic and ferromagnetic materials, and in a few metals. In naturally occurring materials, broken bonds and paramagnetic ions are commonly found in, but not limited to, many crude oils, asphalts, and coals. The presence of these materials in the earth, or elsewhere, may be detected and measured by the invention.

The invention provides rapid detection and measurement as compared to other magnetic resonance methods, such as nuclear magnetic resonance (NMR). The time required to polarize and measure such electrons is commonly on the order of a few microseconds or less.

The invention also includes the use of EPR in combination with nuclear magnetic resonance (NMR) to provide additional advantages, particularly in well logging applications.

BRIEF DESCRIPTION OF THE DRAWINGS

FIGS. 2A–2K illustrate various embodiments of antenna of FIG. 1.

DETAILED DESCRIPTION OF THE INVENTION

The invention described herein is directed to obtaining and interpreting EPR (electron paramagnetic resonance) data from crude oil contained in formations and structures beneath the earth's surface. As explained below, the ESR data can be used in conjunction with NMR (nuclear magnetic resonance) data to determine porosity and permeability features. EPR is also known as electronic spin paramagnetic resonance (ESR).

Figure 1:
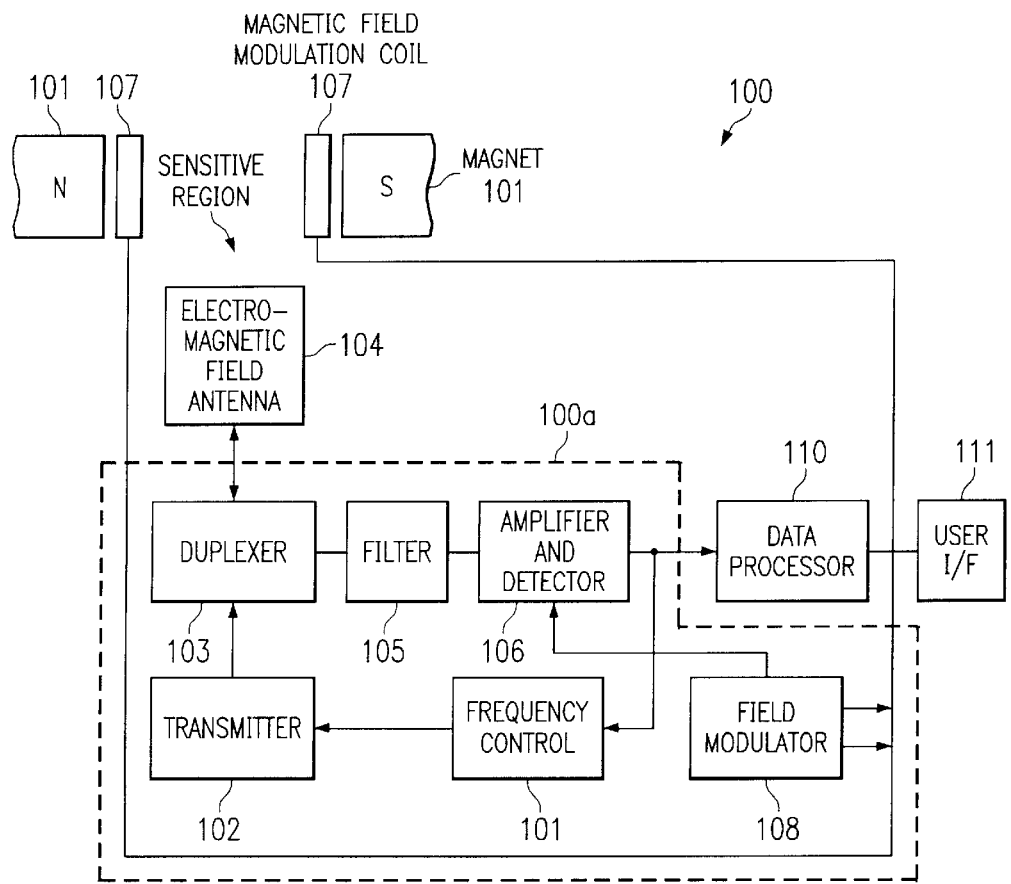
FIG. 1 illustrates an NMR/ESR detector in accordance with the invention.

FIG. 1 illustrates an EPR detector 100 in accordance with the invention. As explained below, FIG. 1 is an illustrative embodiment, and many variations of this embodiment are within the scope of the invention. Essentially, detector 100 generates the magnetic fields for obtaining an EPR response signal, and receives and analyzes the EPR response signal to determine the crude oil content of an underground formation.

The EPR analysis performed by detector 100 can be supplemented with an NMR analysis, by also using the same detector 100 to generate the magnetic fields appropriate for obtaining, receiving and analyzing an NMR response signal. Although the following description of FIG. 1 is in terms of EPR detection, detector 100 may also be used for NMR detection. As explained below, the use of both EPR and NMR response signals, permits not only crude oil content to be determined, but also characteristics of the underground formation, such as pore size.

A magnet 101 produces a magnetic field of intensity $B_0$ (in gauss) in a sensitive region. As explained below, EPR signals may be detected from materials in the sensitive region. In some embodiments and applications, it may be possible to use the static magnetic field of the earth, without use of a separate magnet. In other words, the earth takes the place of the magnet. As explained below, some EPR applications use modest magnetic fields.

A transmitter 102 provides power at frequency $f_0$, through duplexer 103 (or circulator or coupler) to antenna 104. The result is an electromagnetic field of intensity $B_1$ (in gauss) in the sensitive region. For maximum detection sensitivity, the plane of the $B_1$ field is perpendicular to that of the $B_0$ field. The sensitivity of detector 100 generally varies as a function of $\sin \theta$ where $\theta$ is the angle between the $B_1$ and $B_0$ field vectors.

In addition to transmitting electromagnetic field waves, antenna 104 receives an EPR response signal from the material in the sensitive zone. The incoming signal is delivered via duplexer 103 and filter 105 to a radio frequency (RF) amplifier/detector 106.

As explained below in connection with FIG. 4, as an alternative to using the same antenna 104 for both transmission and reception, a second (receiving) antenna may be used for reception of the EPR response signal. This receiving antenna would be located in view of the sensitive zone, and connected through filter 105 to RF amplifier/detector 106. The receiving antenna could be oriented and located to reject direct pickup of the transmitter signal from the transmitting antenna 104, while obtaining maximum pickup of the cross polarized component of the EPR response signal from the sensitive zone. If a separate receiving antenna is used, then duplexer 103 is not required and transmitter 102 may be connected directly to the transmitting antenna 104.

To provide the EPR response signal with a unique identification signature, such as for detection in a "cluttered" or "noisy" background, detector 100 may incorporate a modulation feature. A variety of different modulation techniques may be used either singly or in combination. Coils 107 may be used for this purpose, energized with ac current.

One modulation technique involves modulation of the intensity of the magnetic field, $B_0$. As an example, $B_0$ may be slowly swept through resonance, and the peak amplitude of the detected signal detected and recorded. The presence of a signal at a specific range of the sweep is detected. Combining the slow sweep with low frequency field modulation (i.e. typically under 100 MHZ) using coils 107, allows synchronous detection of the EPR signal at the AC modulation frequency as well as improves the stability and useable detection sensitivity.

A fixed $B_0$ field for electron magnetic resonance on the transmitter frequency, $f_0$, may be modulated by a high frequency current of frequency, $f_1$, in coils 107. As a result, any EPR response from material in the sensitive region will contain spectral components of $f_0$ as well as of $f_0 \pm f_1$. If $f_1$ is greater than the line width of the normal EPR signal, then filter 105 may be set to pass only the upper $(f_0+f_1)$ or lower $(f_0-f_1)$ sideband and to reject the strong direct transmitter signal at frequency $f_0$. The sideband signal amplitude will be proportional to the unpaired electrons in the sensitive region. Quadrature detection means may be used to recover both upper and lower sidebands simultaneously while rejecting $f_0$ for more sensitive detection. A frequency controller 109 uses detected data to maintain the frequency of transmitter 102 on the EPR frequency.

Another modulation method uses transmitter 102 to produce pulsed RF signals of the EPR frequency, $f_0$. The pulses are short compared to a relaxation time, $T_2$, which is explained below. For example, the pulse duration might be the reciprocal of the spectral line width. For EPR, such conditions typically require pulses having a duration within a range of 2 to 10 nanoseconds. The field modulation coils 107 and field modulator 108 are not required for the pulse mode.

The EPR response signal is received by amplifier/detector 106. A data processor 110 stores and executes programming appropriate to perform various calculations, which are explained below. As explained below, processor 110 analyzes the EPR response signal, and may also analyze an NMR response signal. It is assumed that processor 110 has appropriate processing memory and program memory for executing the programming. A user interface 111 may provide a display and/or printout of the results of the calculations.

FIGS. 2A–2K illustrate a variety of embodiments of antenna 104. In the following discussion, each different antenna 104 is identified as antenna 104[2x], with the 2x corresponding to the associated figure number 2A–2K.

FIG. 2A illustrates a loop antenna 104(2A). The loop 201 is tuned to the ESR frequency by a capacitor 202. The loop 201 may be round, square, rectangular or any shape and may be open or closed as shown. It may be of a single turn or multiple turns and may be fed by an impedance matching coupler or by a section of open transmission line to form a high "Q" resonant cavity with the loop unshielded.

FIG. 2B illustrates a capacitive loaded loop antenna 104(2B), which is made up of wire or metal strip segments 203 separated by capacitors 204, which tune out part of the reactance. This allows a larger area to be made resonant at a higher EPR frequency than would be possible without capacitors 204. Loop antenna 104(2B) is coupled to detector 100 through an impedance matching network which may also act with antenna 104(2B) as a high "Q" resonator.

FIG. 2C illustrates a resonant half-wavelength dipole antenna 104(2C), which is coupled to detector 100 through a matched transmission line. Antenna 104(2C) may be located in close proximity and parallel to the plane of a metal plate to improve the directivity and increase the Q.

FIG. 2D illustrates a crossed dipole antenna 104(2D). The two dipoles 205 and 206 are perpendicular to each other and electronically phased at 90 degrees to each other to produce a circularly polarized wave or at 0 or 180 degrees to produce a linear polarization. The crossed dipole antenna 104(2D) may also be located in close proximity to the plane of a metal plate 207 to improve the directivity and increase the Q.

FIG. 2E illustrates a microstrip "patch" antenna 104(2E), which has a metal conducting layer 209 separated by a thin low-loss dielectric 210, from a metal backing plate 211. Layer 209 is approximately one-half wavelength electrically square and may be fed by an impedance matched coaxial transmission line from a tap point and the backing plate 211 to produce a vertical H-plane wave, a horizontal H-plane wave, or circular polarized wave, as selected by the position of the tap point. Layer 209 may be round or elliptical or rectangular. Patch antenna 104(2E) has a high Q and a directivity that are controlled by its physical size, the thickness of insulation layer 210, the dielectric constant of insulator layer 210, and the size of backing plate 211. Multiple patch antennas 104(2E) may be used in an array and appropriately phased to produce greater directivity, a larger near field sensitive region, and a far field of reduced beamwidth. The layer structure of antenna 104(2E) may be curved to fit around a portion of a round pipe or rod.

FIG. 2F illustrates a rectangular patch antenna 104(2F) and FIG. 2G illustrates a rectangular patch antenna 104(2G) on a curved backing. The metal conducting layer 212 is resonant at the frequency $f_0$ being substantially one-half wavelength long, but substantially less than one-half wavelength wide. These antennas may be used to generate a linear polarized wave, but not a circularly polarized wave.

FIG. 2H illustrates a phased dipole array antenna 104 (2H), comprising a configuration of phased, vertical dipoles 220 mounted around the periphery of a metal tube or rod 221. The 220 dipoles are spaced from rod 221 by a distance selected to meet physical size, impedance, and Q constraints. Antenna 104(2H) is intended for use in bore holes to determine properties of the formation outside the bore hole. The dipoles 220 are electrically phased at 90 degrees relative to each other by feed line network 222 to produce a circular pattern about rod 221 with the H-field encircling the rod 221. Rod 221 could be magnetized axially to produce H-field lines parallel to the rod. This causes a sensitive zone to encircle rod 221 at a distance where the B-field intensity is adequate for EPR or NMR at the transmitter frequency. Additional encircling arrays of dipoles 220 may be used around rod 221 to extend the axial length of a sensitive region in the formation that is coaxial with and along the axial direction of rod 221.

FIG. 2I illustrates a phased patch array antenna 104(2I), which is similar in concept to the antenna of FIG. 2H, except that patch type antennas 223 are used in the phased encircling array. Antenna 104(2I) is particularly advantageous because it may be mounted to directly fit the contour of the rod 224 (or magnet) due to a metal backing plate. The encircling patches 223 are electrically phased at 90 degrees by a feed line network to produce a circular sensitive zone that is coaxial with the magnet. By selection of the feed point the H-field from the patch array may be made vertical, horizontal or circular to allow a match to the requirements of different magnetic field directions and configurations. Patch arrays may be stacked vertically along the rod to extend the length of the sensitive region.

FIG. 2J illustrates a horn antenna 104(2J), which provides a directive pattern and field concentration that can extend the useful range between the ESR sensor and the sensitive region of the material. The H component of the $B_1$ field may be vertical or horizontal, as required to make the $B_1$ field perpendicular to the $B_0$ field.

FIG. 2K illustrates a solenoid coil or helical antenna 104(2K). The helical configuration is approximately one wavelength in diameter. The sensitive region extends along the axis from one end of the coil. The directivity increases with number of turns. A backing plate (reflection) is used at the feed end.

FIGS. 3A–3G illustrate a variety of embodiments of magnet 101. Each of these magnets 101 provides the $B_0$ field required to establish resonance at the selected EPR frequency. In the following discussion, each different magnet 101 is identified as magnet 101[3x], with the 3x corresponding to the associated figure number 3A–3G.

Figure 3A:
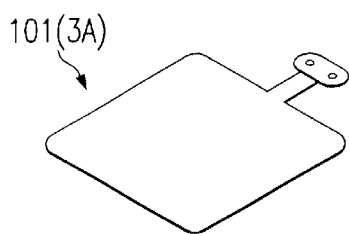
FIGS. 3A–3G illustrate various embodiments of the magnet of FIG. 1.

FIG. 3A is a loop type electromagnet 101(3A), which carries an electrical current and produces a magnetic field that is oriented perpendicular to the plane of the loop. The current may be a DC current to provide a static magnetic field, in particular, a static magnetic field that adds to the earth's magnetic field intensity in the area of the loop and in the spatial volume extending both above and below and around the loop area. The current may be an AC current of a selected frequency to modulate the magnetic field intensity as described above. The loop may have a round, square, rectangular, triangular, or non-uniform shape. Its size is comparable to the maximum distance to the desired locations of the sensitive region outside the area of the loop. The loop may be operated on the surface of the earth, for example, for detection of EPR signals from materials below the surface of the earth. Electromagnet 101(3A) could be oriented to provide a polarized $B_0$ field in the desired spatial region. Two loop antennas 101(3A) may be used side by side in the same plane to produce a magnetic field component, parallel to the plane and both above and below the loops, in the space between the loops. Antenna 104 would be oriented to provide the properly polarized $B_1$ field in this region.

Figure 3B:
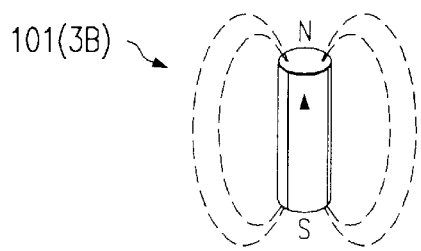

FIG. 3B illustrates a rod magnet 101(3B), which provides a field along the axis and a near coaxial $B_0$ field along its length. The $B_0$ field intensity decreases as a function of distance away from the diameter of rod antenna 101(3B), but is constant at all angles in a plane perpendicular to the axis. At a given radial distance, the magnetic field varies symmetrically above and below the center of magnet 101(3B). The magnetic field is generally oriented parallel to the axis but deviates substantially near the end of the rod magnet 101(3B). The antenna 104 used with magnet 101(3B) should produce a $B_1$ field that is oriented parallel to a plane that is perpendicular to the $B_0$ field lines. That is, $B_1$ is generally perpendicular to the axis of magnet 101(3B). The most sensitive region is where the $B_0$ and $B_1$ lines are perpendicular and where $B_0$ causes an EPR response (and/or NMR response, if used) at the desired frequency(s). Rod magnet 101(3B) may be a permanent magnet or a solenoid type of electromagnet.

Figure 3C:
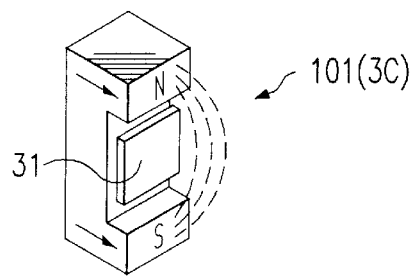

FIG. 3C illustrates a U-shaped magnet 101(3C), whose open faces are its poles. The $B_1$ field of interest is oriented vertically. The sensitive region is outside the physical extent of the poles and in the vertical region corresponding to the area of the gap. The field intensity generally decreases as a function of distance away from the plane of the poles. A ferromagnetic plate 31 between the N and S poles provides a spatial region over a specific distance range (from the plane of the pole faces) in the sensitive zone, over which the $B_0$ field is more uniform than without plate 31. Antenna 104 is located in the gap between the poles and oriented to produce a $B_1$ field in the horizontal plane, that is, perpendicular to the plane of the poles. The angular coverage of $B_0$ about the pole-to-pole axis of magnet 101(3C) is a maximum of under 90 degrees. Over this angular range the position of the line of constant intensity, relative to this axis, varies. Magnet 101(3C) may have a square or rectangular cross section as shown, or it may be round.

Figure 3D:
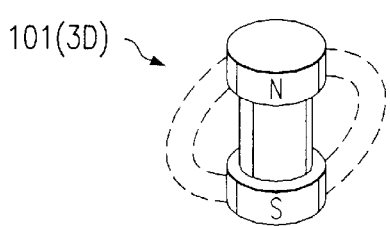

FIG. 3D illustrates another U-shaped magnet 101(3D), which provides a uniform field, as a function of angle about the axis, over 360 degrees. The poles are of uniform magnetic intensity around the complete circumference and polarized radically with the connecting rod (or tube), providing additional magnetic field or a ferromagnetic return path. The $B_0$ field is oriented from pole-to-pole and extends radially outward from the magnet about the gap between the poles. The $B_0$ field generally decreases with radial distance. However, use of a shunt in the gap, the shunt being a length of ferromagnetic tube of selected wall thickness and diameter (near that of the poles), will provide a region of reduced gradient at a selected range of radical distances. The antenna 104 is located in the gap between the poles and outside the ferromagnetic shunt and produces a $B_1$ field perpendicular to the $B_0$, preferably of uniform intensity as a function of angle about the axis.

The antenna of FIGS. 2B and 2I are particularly useful with magnet 101(3D) and produce a sensitive region of a "donut" or cylindrical shape at a selected distance about magnet 101(3D). The $B_0$ field is appropriate for EPR (or NMR) at the selected transmitter frequency.

Figure 3E:
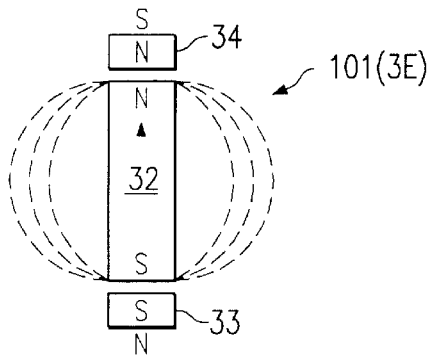

FIG. 3E illustrates an enhancement for certain of the above-described magnets to minimize the loss of magnetic flux out of the top and bottoms of the magnets. The main magnet 32 could be magnet 101(4B), 101(3C), or 101(3D). Auxiliary magnets 33 and 34 are polarized similar to the ends of the main magnets to force more lines of flux outward, radially, and increase the intensity of the $B_0$ field.

Figure 3F:
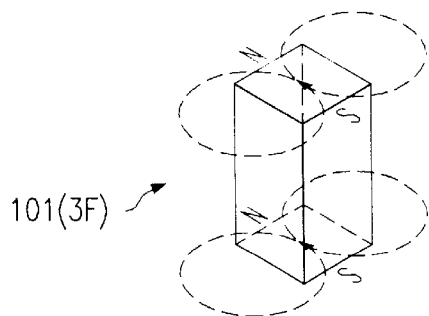

FIG. 3F illustrates a magnet 101(3F) that is polarized perpendicular to the axis, and that produces a $B_0$ field that is also polarized perpendicular to the axis. The $B_0$ field region of interest is perpendicular to the plane of the poles and decreases in intensity as a function of distance away from magnet 101(3F). The $B_1$ field is polarized along the plane of the axis. The sensitive zone is perpendicular to the plane of the poles and along the axis at a selected distance from the center line.

Figure 3G:
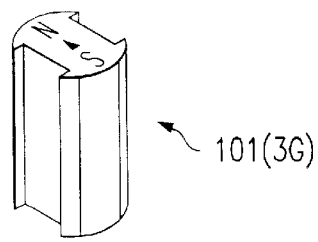

FIG. 3G illustrates a magnet 101(3G), which is similar to magnet 101(3F), except that it is round to better fit in a bore hole. A slot on each side permits antenna 104 to be within the selected overall diameter.

Figure 4:
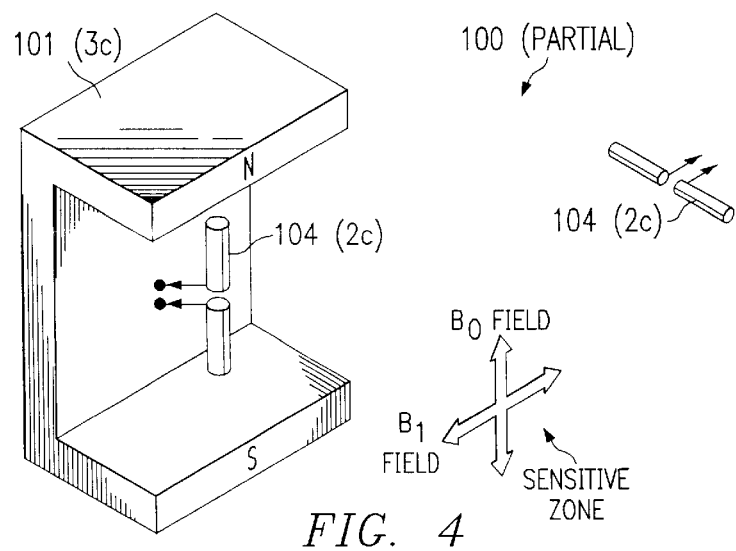
FIG. 4 illustrates the magnet and antenna of FIG. 1, and a second antenna, such that the generation of the $B_1$ field and the detection of response signals are performed by two different antennas.

FIG. 4 illustrates one example of a magnet 101 and antenna 104 combined for stimulating and sensing EPR response signals. The U-shaped magnet 101(3C) provides the $B_0$ field in the sensitive zone. Antenna 104(2C), mounted in the gap, provides the $B_1$ field. As illustrated, a second antenna 104(2C), oriented perpendicular to the first antenna may be used. The two antennas 104(2C) are shielded from each other to the extent possible. One antenna 104(2C) is the transmit antenna to generate the $B_1$ field. The other antenna 104(2C) is the receive antenna to intercept the EPR response signals from the materials being measured. Both antennas have a direct and unshielded path to the sensitive region. The configuration of FIG. 3 is an alternative to the embodiment of FIG. 1, where a single antenna 104(2C) functions both to generate the $B_1$ field and to intercept the EPR response signals from the material in the sensitive region.

Operation of the Invention

The method of the invention involves obtaining and analyzing EPR response data from an underground rock formation. The result is a determination of the crude oil concentration in the underground formation. NMR response data may also be obtained and analyzed to provide additional information about characteristics of the formation, such as its porosity and the total hydrocarbon materials in the formation.

Equipment for obtaining NMR data is known in the art of oil exploration. The same magnets 101 and antennas 104 as those described above for obtaining EPR response signals may be used. However, different control electronics will be more suitable for NMR because of the difference in polarization times, excitation frequency, and response signal sensitivity. For example, NMR polarization times are typically 0.2 to 0.8 seconds for oil and 2.0 to 2.5 seconds for water, whereas polarization times for EPR are in the order of microseconds. In the same static magnetic field, EPR frequency is greater than that of NMR by a factor of about 658 and the sensitivity is proportionally greater.

For obtaining the NMR data, the material to be evaluated is located in a static magnetic field $B_0$. For transient NMR, the material is also preferably exposed to one or more pulses of a radio frequency (RF) field, $B_1$. Selected nuclei in the material will absorb energy from the $B_1$ field, and will produce a detectable response when the RF frequency, $v_0$, is related to the $B_0$ field, by the Larmor equation:

$$v_0 = \gamma B_0 / 2\pi, \quad (1)$$

where $\gamma$ is the gyromagnetic ratio of the particular absorbing nuclei. Following the RF pulse (or pulses), the resonating nuclei precess in the field at an angular frequency, $\omega_0$, and will induce small transient signal voltages in an adjacent sensor coil. These NMR signals are the magnetization decay signals. This method is generally called time domain NMR, and the peak amplitude of the response signal is proportional to the concentration of selected atomic specie (e.g. hydrogen) in the measured volume of material.

When nuclei absorb energy, thermal equilibrium is disturbed and the absorbed energy is exchanged exponentially with the surroundings. These exchanges are characterized by two preliminary time constants: the spin-lattice ($T_1$) and the spin-spin or transverse ($T_2$) relaxation times. The first time constant, $T_1$, is related to the time required for nuclei in the material being measured to become polarized in a magnetic field. $T_1$ also sets the minimum time that the material must be exposed to a magnetic field prior to an NMR measurement and it determines how rapidly NMR measurements can be beneficially repeated on the same sample. The second time constant, $T_2$, determines how rapidly the NMR signal decays in a perfect magnetic field.

In general, low-field NMR measures three useful parameters: the equilibrium nuclear magnetization, $M_n$, which is proportional to the total signal amplitude and to the fluid-filled porosity, and $T_1$, and $T_2$, which are the two relaxation time constants. These parameters can be correlated with petrophysical properties such as pore size, producible fluid, and permeability.

In fluid-saturated porous rock, the fluids may interact with the rock surface to promote NMR relaxation. As a result, the $T_2$ values for fluids in pores can be shorter than for bulk fluids. In the fast diffusion limit, the $T_2$ relaxation rate, $1/T_2$, is proportional to the surface-to-volume (S/V) ratio of a pore, such that:

$$1/T_2 = \rho(S/V)_{pore}. \quad (2)$$

The factor $\rho$ is the surface relaxivity, which is a measure of the rock surface's ability to enhance the relaxation rate. It falls within a reasonably narrow band for a broad sampling of sedimentary rocks and is typically a few micrometers per second. For example, p is approximately 0.0005 cm/s for carbonates, and is approximately 0.0015 cm/s for sandstone. The volume, V, is the pore size. The surface area, S, varies depending on the shape of the pore and the roughness of the surface.

Permeability estimation using NMR is based on the fact that permeability has dimensions of length squared, and uses the pore size obtained from NMR data. By knowing S/V for the pore, the permeability of a porous medium can be estimated. For carbonate, the following estimate for permeability, k, can be used:

$$k = \phi^4 (V/S)^2, \quad (3)$$

where $\phi$ is the porosity. Thus, the permeability is proportional to $(1/T_2)^2$.

Porosity also may be measured from the NMR signal amplitude. NMR proton magnetization amplitude is directly proportional to the fluid-filled porosity. In the excitation sequence (90°—t—180°—echo—delay) for spin-spin relaxation measurement, if a fluid is assumed to be contained in a single pore size, the echo following the 18° rotation of the magnetization vector is given by:

$$M(t) = M_0 \exp(-t/T_i), \quad (4)$$

where $M_0$ is the magnetization at equilibrium, and $M(t)$ is the observed magnetization as a variable delay time, t, between the 90° and 180° measurement pulses. For a porous rock, the observed magnetization will depend on various $T_2$ parameters of all pores, that is, on the various pore sizes.

Because the NMR relaxation time is proportional to pore size, and it is known that rocks have broad distributions of pore sizes, NMR transverse relaxation ($T_2$) data can be expressed as a sum of exponential functions:

$$M(t) = \Sigma M_i \exp(-t/T_{2i}), \quad (5)$$

where $M_i$ is proportional to the number of spins with relaxation time constant $T_{2i}$. $M(t)$ is the sum of all NMR magnetization decays of the fluid-saturated rock.

The preceding equation for $M(t)$ can be inverted into a $T_2$ relaxation time distribution. Thus, instead of estimating a single relaxation time from magnetization decay, a spectrum (distribution) of relaxation times, $M(T_{2i})$, is estimated.

Computing a $T_2$ spectrum from $M(t)$ is not straightforward. The relaxation time, $T_2$, is a function of the type of fluid, proton frequency, temperature, pore surface chemistry, and pore size. For a porous rock, the observed magnetization will depend upon the $T_2$ (i.e., pore size) of all pores. The variation of magnetization with time may be obtained by summing over all $T_2$'s:

$$M(t) = M_0 \int \exp(-t/T_2) f(T_2) dT_2, \quad (6)$$

where the limits of integration, $T_{2min}$ and $T_{2max}$ represent the smallest and largest values of $T_2$ expected for the particular rock. $T_{2max}$ may be taken to be the value for the bulk fluid used to saturate the pores. The function, $f(T_2)$, is the desired $T_2$ distribution, which is related to the pore volume distribution. The extraction of $f(T_2)$ from the observed magnetization, $M(t)$, requires the solution of the preceding equation.

In water-saturated rocks, the bulk water relaxation rate, $(1/T_{2B})$ is often negligible because the bulk water relaxation time, $T_{2bulk}$, is about 2–3 seconds. However, for water in pores, $T_2$ is only from several milliseconds to a few hundred milliseconds, and the distribution of $T_2$ arises from the distribution of surface-to-volume ratios of the pores, as shown above. Because $T_2$ depends linearly on pore size, the $T_2$ distribution corresponds to pore size distribution, with the largest pores having the longest relaxation times. It can be concluded that if $M_i$ in the preceding equation is plotted against $T_{2i}$, it can be rescaled according to the above equation for $1/T^2$ to obtain the pore size distribution. This M versus $T_{2i}$ data is a useful way to present NMR relaxation data.

The above calculations assume that the rock is filled with a given fluid. However, in practice, the fluid is comprised of both water and oil, which affect the NMR data differently. For example, oil has a proton density that is about 5–15% higher than for water. For this reason, and others, it is not always possible to obtain accurate porosity and permeability estimates from NMR data alone. For this reason, detector 100 is used to acquire EPR data.

Electron paramagnetic resonance (EPR) is similar in principal to NMR, but the response is due to unpaired electrons or free radicals instead of nuclei. When a sample with unpaired electrons is placed in a static magnetic field of strength Bo, there is an interaction between the electrons and the magnetic field. The two spin orientations of an electron, which are degenerate in the absence of the magnetic field, are split when they are placed in a magnetic field. The degree to which they are split depends on the strength of the applied magnetic field.

To effect transitions between these energy levels, a resonance condition must be fulfilled. Expressed mathematically:

$$\epsilon_0 = g\beta_0 B_0, \quad (6)$$

where g is a spectroscopic splitting factor and $\beta_0$ is the Bohr magneton of the electron. Typically, for free radicals (unpaired electrons), measurements in the laboratory are made at X-band. For resonance, the $B_0$ field is around 3300 gauss and the EPR frequency is centered about 9.25 GHz (nominal).

EPR occurs at a nominal frequency of 2.8 MHZ per gauss of the static magnetic field, which is about 658 times as great as for NMR in the same magnetic field. Consequently most laboratory EPR work is carried out at microwave frequencies (GHz). For better (deeper) penetration of the formation, EPR for borehole and other earth measurements uses relatively low frequencies and modest magnetic fields. These range from 28 to 2800 MHZ and 10 to 1000 gauss, respectively.

Figure 5A:
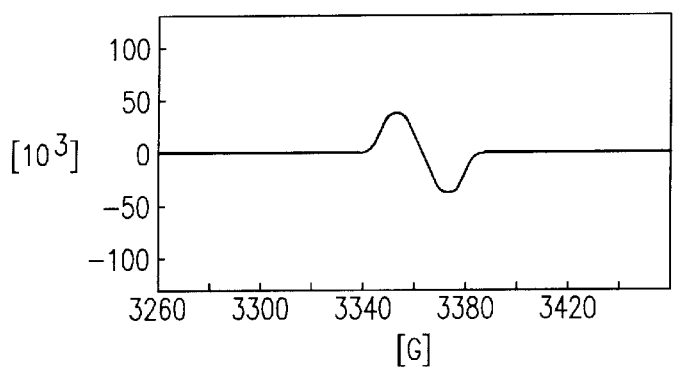
FIGS. 5A–5D illustrate EPR signals from four different crude oil fields, respectively.
Figure 5B:
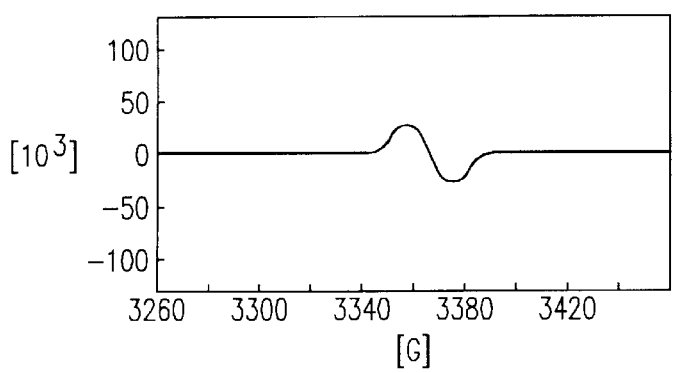
Figure 5C:
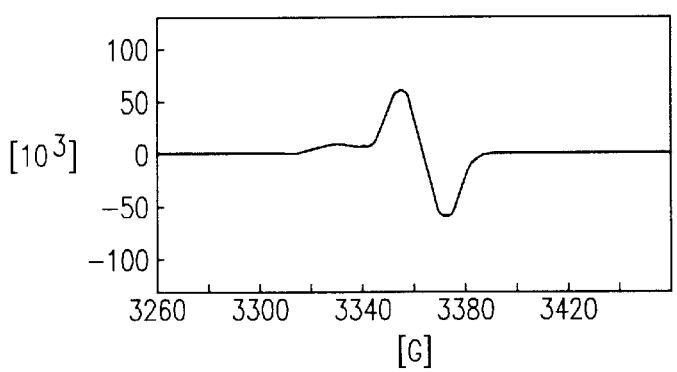
Figure 5D:
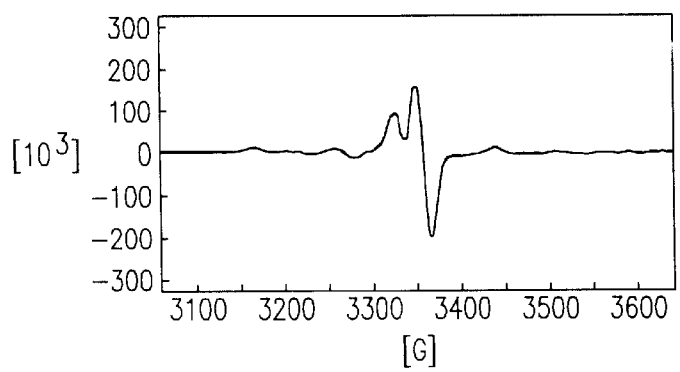

FIGS. 5A–5D illustrate EPR signals from crude oil obtained from four different oil fields. The static magnetic field strength (in gauss) is plotted against the amplitude of the EPR response signal. EPR signals are not produced by water or gas, but are produced by many, if not all, crude oils. By using EPR to sense the oil in fluid-rock, the amount of oil can be directly measured. The amplitude of the EPR signal is proportional to the amount of the oil inside the rock. For a known volume of the sensitive region, a concentration of crude oil per unit volume can be determined. Although not all crude oils have the same signal amplitude for a given concentration, calibration factors for the type of oil can be readily determined and applied. In addition, EPR spectra can provide information about some oil constituents. In FIG. 5D, there is an additional resonance peak, which is possibly due to contributions from two or more radical species with different heteroatom compositions.

Using a combination of EPR and NMR measurements, the components of water and oil in the NMR signal can be separated. Specifically, by subtracting the concentration of crude oil from the concentration of total hydrogen-bearing material, the concentration of water is known.

Based on a number of facts, the components of water and oil in a rock sample can each be accurately measured from a combination of EPR and NMR measurements. These facts include: an EPR response signal is produced by crude oils but not by water, the proton density in oil is about 5–15% higher than water on a volumetric basis, and the surface relaxivity for oil is about one-third that of water. The relationship between pore size and the $T_2$ relaxation rate, as expressed above, can be rewritten as:

$$1/T_2 = f_{water} \rho_{water} (S/V)_{pore} + f_{oil} \rho_{oil} (S/V)_{pore},$$

where $\rho_{water}$ and $\rho_{oil}$ are the surface relaxivities, and $f_{water}$ and foil are the fraction weights, for water and oil respectively. As indicated, the relaxation rate is a sum of two terms: one representing the effect of crude oil and one representing the effect of water.

When oil and water coexist in a pore, the relaxation rate $(1/T_2)$ of fluid in contact with rock surfaces is enhanced by those surfaces. The fraction of oil in a water-oil mixture can be used to increase the accuracy of the calculation of $1/T_2$. This, in turn, increases the accuracy of estimates of pore size distribution and permeability of the rock formation about boreholes or in fluid-saturated cores.

For example, for 50% oil and 50% water mixtures, if in a carbonate, $\rho_{water}$ is 0.0005 cm/s, $\rho_{oil}$ is (⅓)0.0005 cm/s, and $T_2$ is 0.5 seconds, then from the above equation, the calculated pore diameter is 10 microns. However, if only NMR measurements were used, the calculated pore diameter would be 15 microns. The permeabilities for 10 and 15 micron pore sizes are 0.04 and 0.09 microns squared, respectively, resulting in a nearly 2:1 difference.

The detection and measurement of the EPR data and of the NMR data may be performed separately in time. Thus, it is not necessary that these two types of data be acquired with the same equipment. For example, if the EPR data is otherwise obtained, such as by using the equipment described herein, existing NMR equipment may be used for the NMR measurements. Although it is possible to use the same equipment for both EPR and NMR detection and measurement, it is not necessary to do so.

Other Embodiments

Although the present invention has been described in detail, it should be understood that various changes, substitutions, and alterations can be made hereto without departing from the spirit and scope of the invention as defined by the appended claims.

What is claimed is:

1. An EPR/NMR apparatus for detecting petrophysical features of a fluid-filled underground formation having a region of static magnetic field sensitivity, comprising:
    at least one antenna for providing an RF magnetic field in said region at an EPR frequency, and for receiving an EPR response signal from the fluid;
    a transmitter operable to provide power at said EPR frequency;
    a detector for receiving said ESR response signal from said antenna;
    a processor operable to analyze said EPR response signal by relating the amplitude of said EPR response signal to an estimated amount of crude oil in said underground formation;
    at least one antenna for providing an RF magnetic field in said region at an NMR frequency and for receiving an NMR response signal, and wherein said processor is further programmed to analyze said NMR response signal by relating the amplitude of said NMR response signal to an estimated amount of hydrogen-bearing fluid in said underground formation; and
    a transmitter operable to provide power at said NMR frequency to said antenna;
    wherein said processor is further operable to calculate the oil and water fractions in said fluid, to determine a NMR relaxation rate, and to calculate a pore size distribution of pores of said underground formation, based on said relaxation rate.

2. The EPR/NMR apparatus of claim 1, wherein said processor calculates said pore size distribution for a single fluid as measured by NMR response data.

3. The EPR/NMR apparatus of claim 1, wherein said processor calculates said pore size distribution using said crude oil and water fraction values.

4. The EPR/NMR apparatus of claim 1, wherein said processor further calculates the permeability of said underground formation, based on said pore size distribution.

5. The EPR/NMR apparatus of claim 1, wherein said processor is further programmed to calculate pore size distribution of said underground formation based on the amplitude of said NMR response signal.

6. The EPR/NMR apparatus of claim 1, wherein said processor is further programmed to calculate pore size distribution based on the amplitude of the response signal and a distribution of transverse relaxation times.

7. The EPR/NMR apparatus of claim 1, wherein the same transmitter provides power at both the EPR and NMR frequencies.

8. The EPR/NMR apparatus of claim 1, wherein the same antenna provides the RF magnetic fields for both EPR and NMR response signals.

9. The EPR/NMR apparatus of claim 1, wherein the same antenna receives both NMR and EPR response signals.

10. The EPR/NMR apparatus of claim 1, wherein the processor is further programmed to also relate the relaxation time constants of the NMR response signal to the estimated amount of hydrogen-bearing fluid.

11. The EPR/NMR apparatus of claim 1, wherein the processor is further programmed to relate the amplitude of the NMR response signal to the estimated composition of hydrogen-bearing fluid.

12. A computer-implemented EPR/NMR method of detecting petrophysical features of a fluid-filled underground formation having a region of static magnetic field sensitivity, comprising the steps of:
    providing an RF magnetic field in said region at an EPR frequency;
    receiving an EPR response signal;
    analyzing said EPR response signal by relating the amplitude of said EPR response signal to an estimated amount of crude oil in said underground formation;
    providing an RF magnetic field in said region at an NMR frequency;
    receiving an NMR response signal;
    analyzing said NMR response signal by relating the amplitude of said NMR response signal to an estimated amount of hydrogen-bearing fluid in said underground formation;
    calculating the oil and water fractions in said fluid, using the results of said analyzing steps for both EPR and NMR responses; and
    determining a NMR relaxation rate and calculating a pore size distribution of pores of said underground formation, based on said relaxation rate.

13. The method of claim 12, wherein said pore size distribution is calculated for a single fluid as measured by NMR response data.

14. The method of claim 12, wherein said pore size distribution is calculated from said crude oil and water fraction values.

15. The method of claim 12, further comprising the step of calculating the permeability of said underground formation, based on said pore size distribution.

16. The method of claim 12, further comprising the step of calculating pore size distribution of said underground formation based on the amplitude of said NMR response signal.

17. The method of claim 12, further comprising the step of calculating pore size distribution based on the amplitude of the response signal and a distribution of transverse relaxation times.

18. The method of claim 12, wherein the providing and receiving steps associated with the EPR response signal are performed at a time separate from the providing, receiving, and analyzing steps associated with the NMR response signal.

19. The method of claim 12, wherein the providing and receiving steps associated with the EPR response signal are with equipment different from that used for the providing, receiving, and analyzing steps associated with the NMR response signal.

* * * * *